(12) United States Patent
Hsieh et al.

(10) Patent No.: US 11,041,883 B2
(45) Date of Patent: Jun. 22, 2021

(54) PROBE CARD DEVICE AND RECTANGULAR PROBE THEREOF

(71) Applicant: CHUNGHWA PRECISION TEST TECH. CO., LTD., Taoyuan (TW)

(72) Inventors: Chih-Peng Hsieh, Taipei (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 104 days.

(21) Appl. No.: 16/359,369

(22) Filed: Mar. 20, 2019

(65) Prior Publication Data

US 2019/0317131 A1 Oct. 17, 2019

(30) Foreign Application Priority Data

Apr. 16, 2018 (TW) .................................. 107112897

(51) Int. Cl.
*G01R 1/073* (2006.01)
*G01R 1/067* (2006.01)

(52) U.S. Cl.
CPC ..... *G01R 1/07342* (2013.01); *G01R 1/06744* (2013.01); *G01R 1/06755* (2013.01)

(58) Field of Classification Search
CPC ............ G01R 1/07357; G01R 1/06738; G01R 1/06755; G01R 1/07342; G01R 1/06744; G01R 1/07307; G01R 31/2601; G01R 1/07371; G01R 1/07314; G01R 1/06716; G01R 1/0735; H01R 12/714

See application file for complete search history.

(56) References Cited

U.S. PATENT DOCUMENTS

| 2009/0102495 | A1* | 4/2009 | Kister | ................ G01R 1/07314 |
| | | | | 324/750.16 |
| 2016/0299174 | A1* | 10/2016 | Pan | ......................... G01R 3/00 |
| 2016/0363613 | A1* | 12/2016 | Albertson | .......... G01R 1/07314 |
| 2017/0332490 | A1* | 11/2017 | Su | ......................... H05K 3/4007 |
| 2018/0080955 | A1* | 3/2018 | Hsieh | ................. G01R 31/2886 |

* cited by examiner

*Primary Examiner* — Lee E Rodak
*Assistant Examiner* — Brent J Andrews
(74) *Attorney, Agent, or Firm* — Li & Cai Intellectual Property (USA) Office

(57) ABSTRACT

A probe card device includes a first die, a second die, and a plurality of rectangular probes. Each of the rectangular probes includes a middle segment, two extending segments, and two contact end segments. In each of the rectangular probes, the two extending segments are respectively arranged in the first die and the second die, the two contact end segments respectively extend from two opposite ends of the two extending segments along a direction away from the middle segment, each of the two contact end segments includes a conductive portion, and at least one of the two contact end segments includes a piercing portion partially embedded in the conductive portion thereof. A conductivity of the piercing portion is less than that of each of the two conductive portions, and a Vickers hardness number of the piercing portion is larger than that of each of the two conductive portions.

6 Claims, 10 Drawing Sheets

PROBE CARD DEVICE AND RECTANGULAR PROBE THEREOF

CROSS-REFERENCE TO RELATED PATENT APPLICATION

This application claims the benefit of priority to Taiwan Patent Application No. 107112897, filed on Apr. 16, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

BACKGROUND OF THE DISCLOSURE

Field of the Disclosure

The present disclosure relates to a rectangular probe; in particular, to a probe card device and a rectangular probe thereof.

Description of Related Art

In a testing process of semi-conductor wafer, a testing apparatus is electrically connected to an object to be tested by using a probe card device, and the testing apparatus can obtain a testing result of the object to be tested by signal transmission and signal analysis. A conventional probe card device has a plurality of probes corresponding in position to electrical pads of the object, and the probes are used to simultaneously and respectively contact the electrical pads of the object.

Specifically, the probes of the conventional probe card device can be round probes or rectangular probes that are shaped by using a microelectromechanical systems (MEMS) technology according to design requirements. After the rectangular probes are inserted and fastened to a probe carrier of the conventional probe card device, the rectangular probes need to respectively contact electrical pads of a transferring plate of the conventional probe card device to transmit a testing signal to a testing apparatus through a circuit of the transferring plate.

Accordingly, the electrical connection of the rectangular probe and the corresponding electrical pad will affect quality of the signal transmission, but an end portion of the conventional rectangular probe used for contacting the electrical pad is always made of the same material, so that the performance of the electrical connection of the conventional rectangular probe and the corresponding electrical pad is restricted and cannot be further improved.

SUMMARY OF THE DISCLOSURE

The present disclosure provides a probe card device and a rectangular probe thereof to solve the issues associated with conventional rectangular probes.

The present disclosure provides a probe card device, which includes a first die, a second die, and a plurality of rectangular probes. The second die is spaced apart from the first die in a height direction that is substantially perpendicular to the first die. Each of the rectangular probes includes a middle segment, two extending segments, two contact end segments. The middle segment of each of the rectangular probes is arranged between the first die and the second die. The two extending segments of each of the rectangular probes respectively extend from two opposite ends of the middle segment, and are respectively arranged in the first die and the second die. The two contact end segments of each of the rectangular probes respectively extend from two ends of the two extending segments along a direction away from the middle segment, and the two ends are respectively arranged on the two extending segments and are arranged apart from each other. The two contact end segments of each of the rectangular probes are respectively arranged at two outer sides of the first die and the second die. Each of the two contact end segments of each of the rectangular probes includes a conductive portion. In each of the rectangular probes, the middle segment, the two extending segments, and the conductive portions of the two contact end segments are made of the same material and are integrally formed as a one-piece structure. In each of the rectangular probes, at least one of the two contact end segments includes a piercing portion partially embedded in the conductive portion thereof, and a free end of the piercing portion is exposed from the corresponding conductive portion. In each of the rectangular probes, the material of the piercing portion is different from that of each of the two conductive portions, a conductivity of the piercing portion is less than that of each of the two conductive portions, and a Vickers hardness number of the piercing portion is larger than that of each of the two conductive portions.

The present disclosure also provides a rectangular probe of a probe card device. The rectangular probe includes a middle segment, two extending segments respectively extending from two opposite ends of the middle segment, and two contact end segments respectively extending from two ends of the two extending segments along a direction away from the middle segment. The two ends are respectively arranged on the two extending segments, and are arranged apart from each other. Each of the two contact end segments includes a conductive portion. The middle segment, the two extending segments, and the conductive portions of the two contact end segments are made of the same material and are integrally formed as a one-piece structure. At least one of the two contact end segments includes a piercing portion partially embedded in the conductive portion thereof, and a free end of the piercing portion is exposed from the corresponding conductive portion. The material of the piercing portion is different from that of each of the two conductive portions. A conductivity of the piercing portion is less than that of each of the two conductive portions, and a Vickers hardness number of the piercing portion is larger than that of each of the two conductive portions. The free end of the piercing portion is configured to pierce into an external metal pad so as to form a rupture surface on the external metal pad, and the conductive portion arranged adjacent to the piercing portion abuts against the rupture surface.

In summary, regarding the rectangular probe or the probe card device in the present disclosure, at least one of the two contact end segments of the rectangular probe is formed with a piercing portion that is made of a material different from the material of the corresponding conductive portion, so that the piercing portion can provide an additional function to the corresponding contact end segment to improve signal transmission. Specifically, the rectangular probe can use the piercing portion to pierce through an oxidation layer arranged on the external metal pad so as to form a rupture surface on the external metal pad, and the conductive portion connected to the piercing portion may abut against the rupture surface of the external metal pad so as to improve the electrical connection of the conductive portion and the external metal pad.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE EXEMPLARY EMBODIMENTS

References are hereunder made to the detailed descriptions and appended drawings in connection with the present disclosure. However, the appended drawings are merely provided for exemplary purposes, and should not be construed as restricting the scope of the present disclosure.

Figure 1:
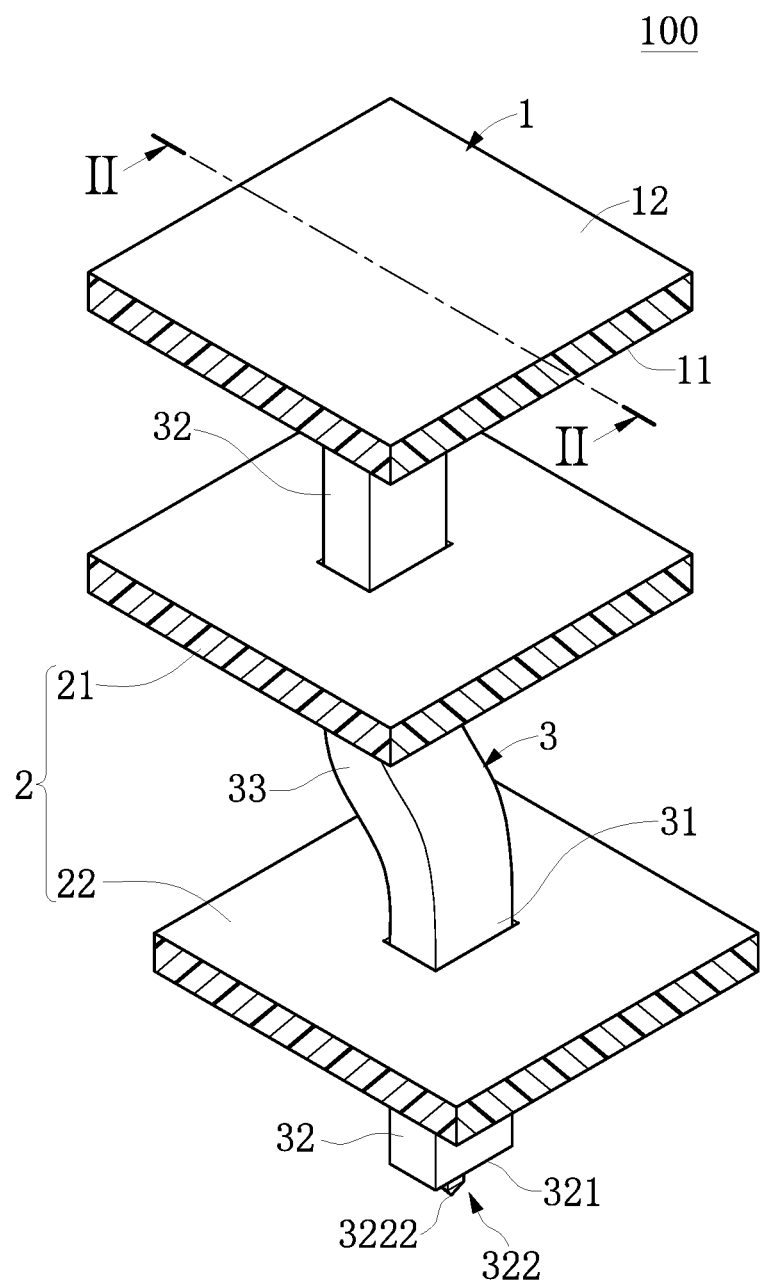
FIG. 1 is a perspective view showing a probe card device according to the present disclosure.

Reference is made to FIGS. 1 to 12, which illustrate embodiments of the present disclosure. As shown in FIG. 1, the present embodiment discloses a probe card device 100 including a transferring plate 1, a probe carrier 2, and a plurality of rectangular probes 3. For ease of illustration of the present embodiment, the figures only show a part of the probe card device 100 (e.g., one of the rectangular probes 3 and corresponding portions of the transferring plate 1 and the probe carrier 2) for clearly showing the structure and connection of each component of the probe card device 100. The following description discloses the structure and connection of each component of the probe card device 100.

As shown in FIG. 1, the transferring plate 1 in the present embodiment is a signal transfer board (STB), and the transferring plate 1 has a first surface 11 and a second surface 12 that is opposite to the first surface 11. The first surface 11 of the transferring plate 1 is electrically connected to the rectangular probes 3, and the second surface 12 of the transferring plate 1 is electrically connected to a circuit board (not shown in the drawings).

Figure 2:
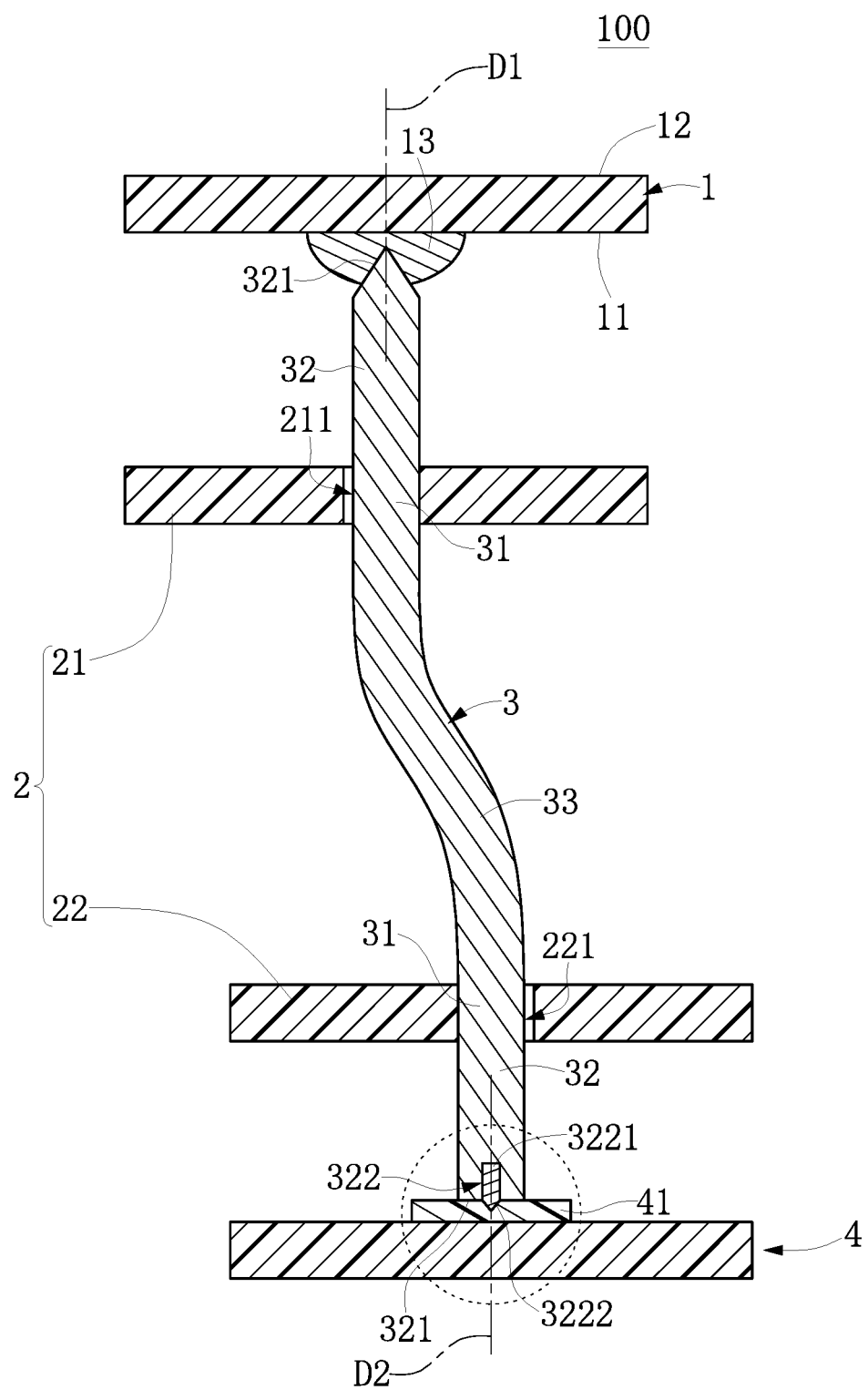
FIG. 2 is a cross-sectional view taken along a cross-sectional line II-II of FIG. 1.
Figure 5:
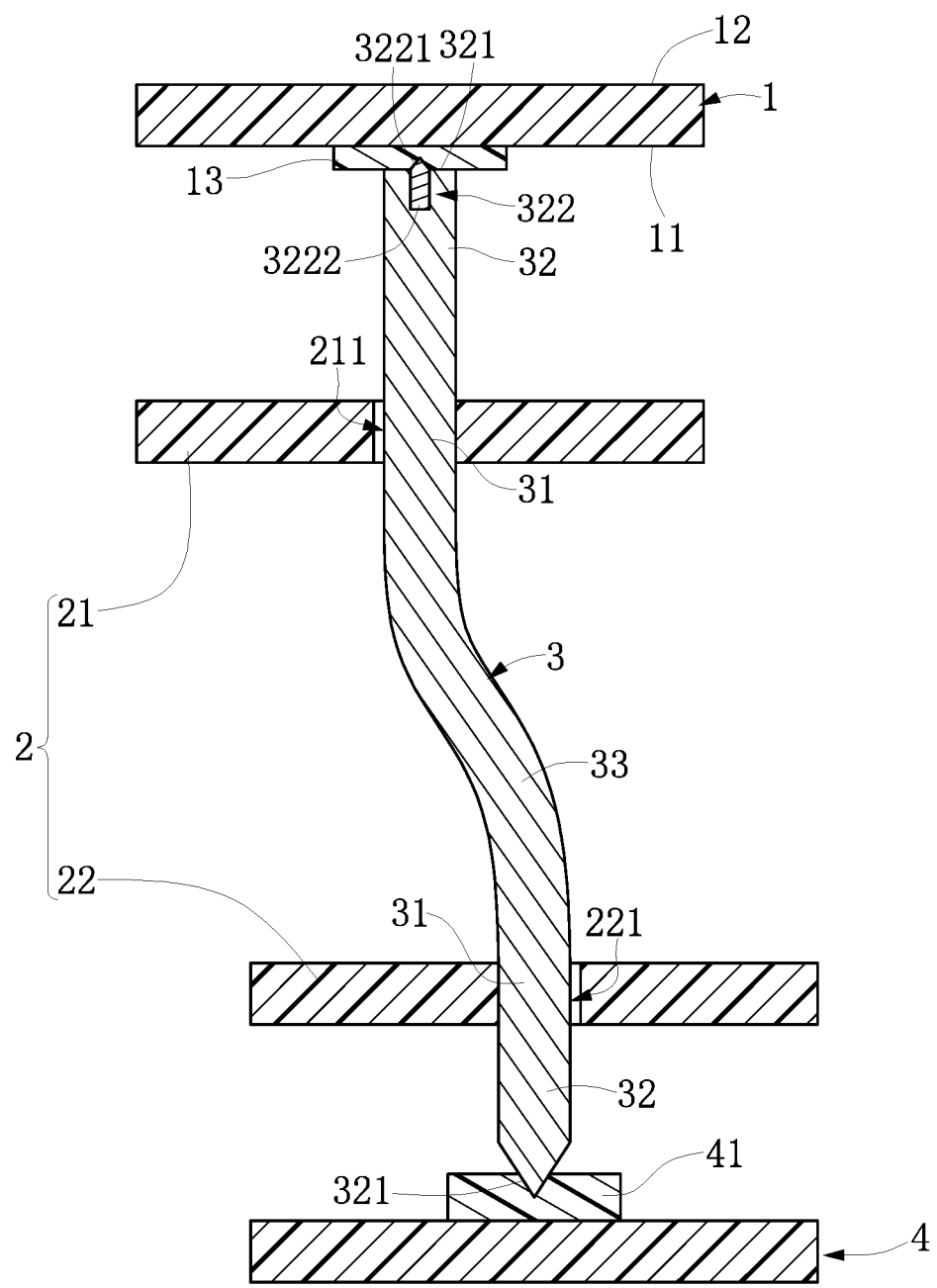
FIG. 5 is a cross-sectional view showing the probe card device in another configuration.
Figure 6:
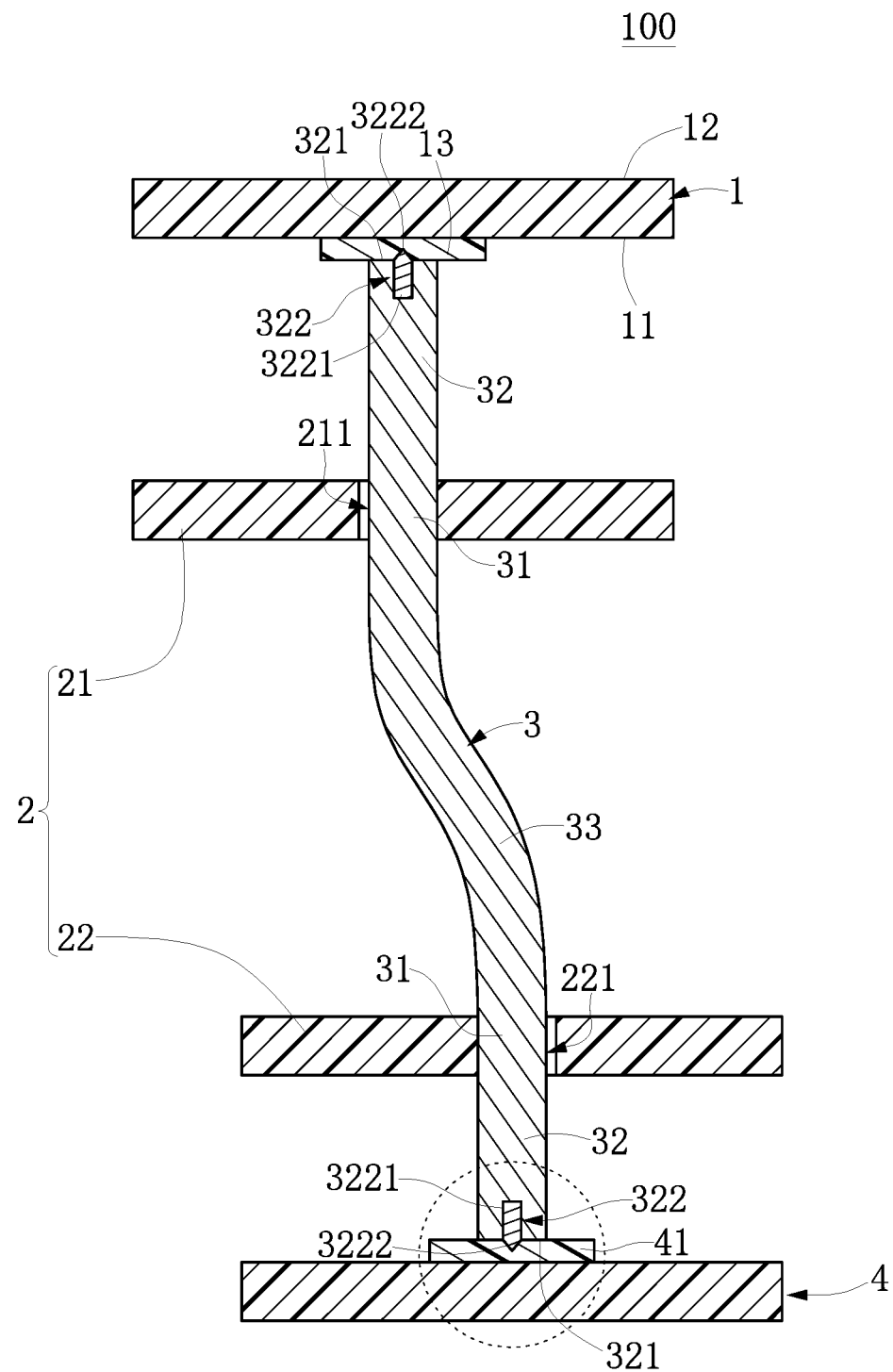
FIG. 6 is a cross-sectional view showing the probe card device in the other configuration.

Specifically, as shown in FIG. 2, the transferring plate 1 includes a plurality of metal pads 13 arranged on the first surface 11, and the first surface 11 of the transferring plate 1 is electrically connected to the rectangular probes 3 through the metal pads 13. Each of the metal pads 13 is preferably formed in a hemispherical shape or an arced shape, but the present disclosure is not limited thereto. In addition, each of the metal pads 13 can be a flat protrusion (as shown in FIGS. 5 and 6) that is made of copper material, nickel material, gold, sequentially from the inside out.

As shown in FIG. 2, the probe carrier 2 includes a first die 21 (i.e., an upper die) and a second die 22 (i.e., a lower die) that is substantially parallel to the first die 21. The first die 21 has a plurality of first thru-holes 211, and the first thru-holes 211 respectively correspond in position to the metal pads 13 along a first direction D1 perpendicular to the first surface 11. The second die 22 has a plurality of second thru-holes 221, and the second thru-holes 221 respectively correspond in position to metal pads 41 of an object 4 to be tested along a second direction D2 perpendicular to the object 4. Moreover, the second thru-holes 221 are respectively staggered with respect to the first thru-holes 211.

Figure 3:
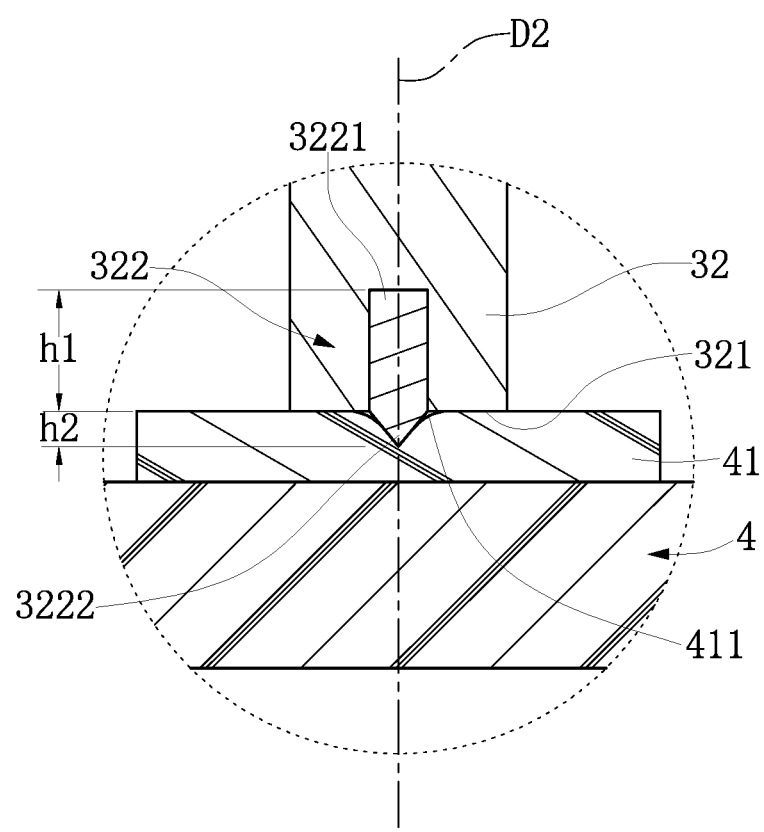
FIG. 3 is an enlarged view showing a portion of FIG. 2.
Figure 4:
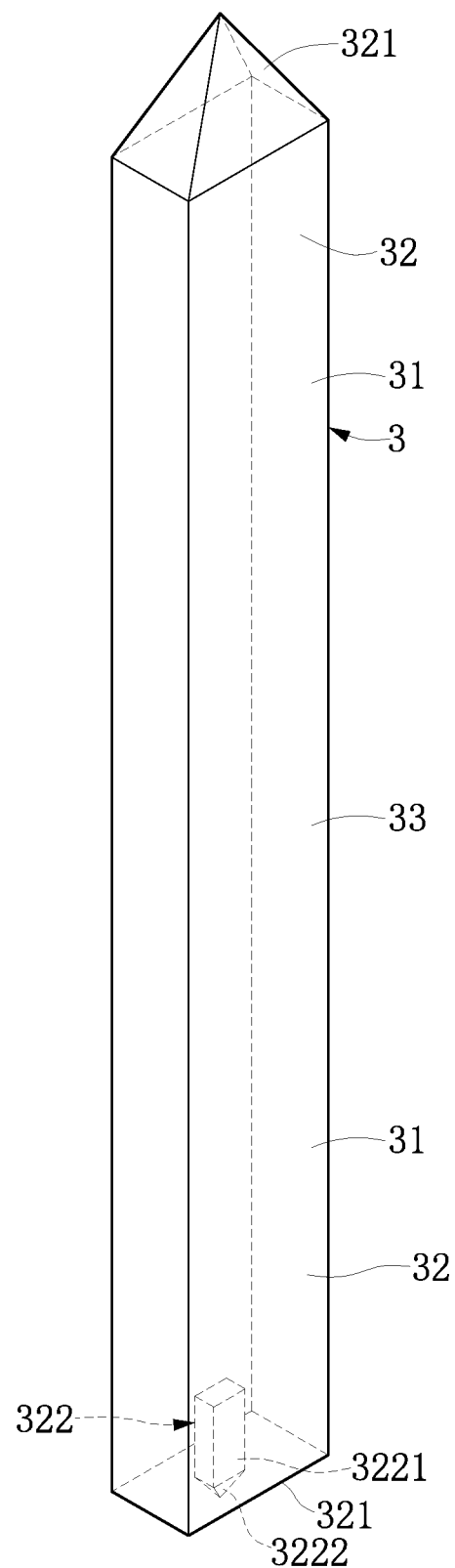
FIG. 4 is a perspective view showing a rectangular probe that is not assembled with a probe carrier.

As shown in FIGS. 2 to 4, each of the rectangular probes 3 in the present embodiment has an elongated structure that is conductive and flexible. Specifically, when the rectangular probe 3 is not fastened to the first die 21 and the second die 22, the rectangular probe 3 is a straight structure. The rectangular probe 3 in the present embodiment can be made by using MEMS technology so as to have a rectangular (including square) cross section The rectangular probe 3 can be made of gold, silver, copper, nickel, cobalt, or an alloy thereof. The rectangular probe 3 in the present embodiment is preferably made by at least one of copper, a copper alloy, a nickel-cobalt alloy material, a palladium-nickel alloy material, a nickel-manganese alloy material, a nickel-tungsten alloy material, a nickel-phosphorus alloy material, and a palladium-cobalt alloy material, but the present disclosure is not limited thereto.

Each of the rectangular probes 3 includes two extending segments 31, two contact end segments 32, and a middle segment 33. The two extending segments 31 respectively extend from two opposite ends of the middle segment 33. The two contact end segments 32 respectively extend from two ends of the two extending segments 31 along a direction away from the middle segment 33, and the two ends are respectively arranged on the two extending segments 31 and are arranged apart from each other.

As shown in FIG. 2, the rectangular probes 3 are fastened to the first die 21 and the second die 22, and are in a matrix arrangement. Specifically, the two extending segments 31 of each of the rectangular probes 3 are respectively arranged in one of the thru-holes 211 of the first die 21 and the corresponding second thru-hole 221 of the second die 22, and the two contact end segments 32 of each of the rectangular probes 3 are respectively arranged at two opposite outer sides of the first die 21 and the second die 22.

The second thru-holes 221 are respectively staggered with respect to the first thru-holes 211 since the first die 21 moves relative to the second die 22. Therefore, the two extending segments 31 of each of the rectangular probes 3 respectively abut against the first die 21 and the second die 22 so that the two extending segments 31 are arranged in a staggered arrangement, and the middle segment 33 is forced to be curved.

Figure 7:
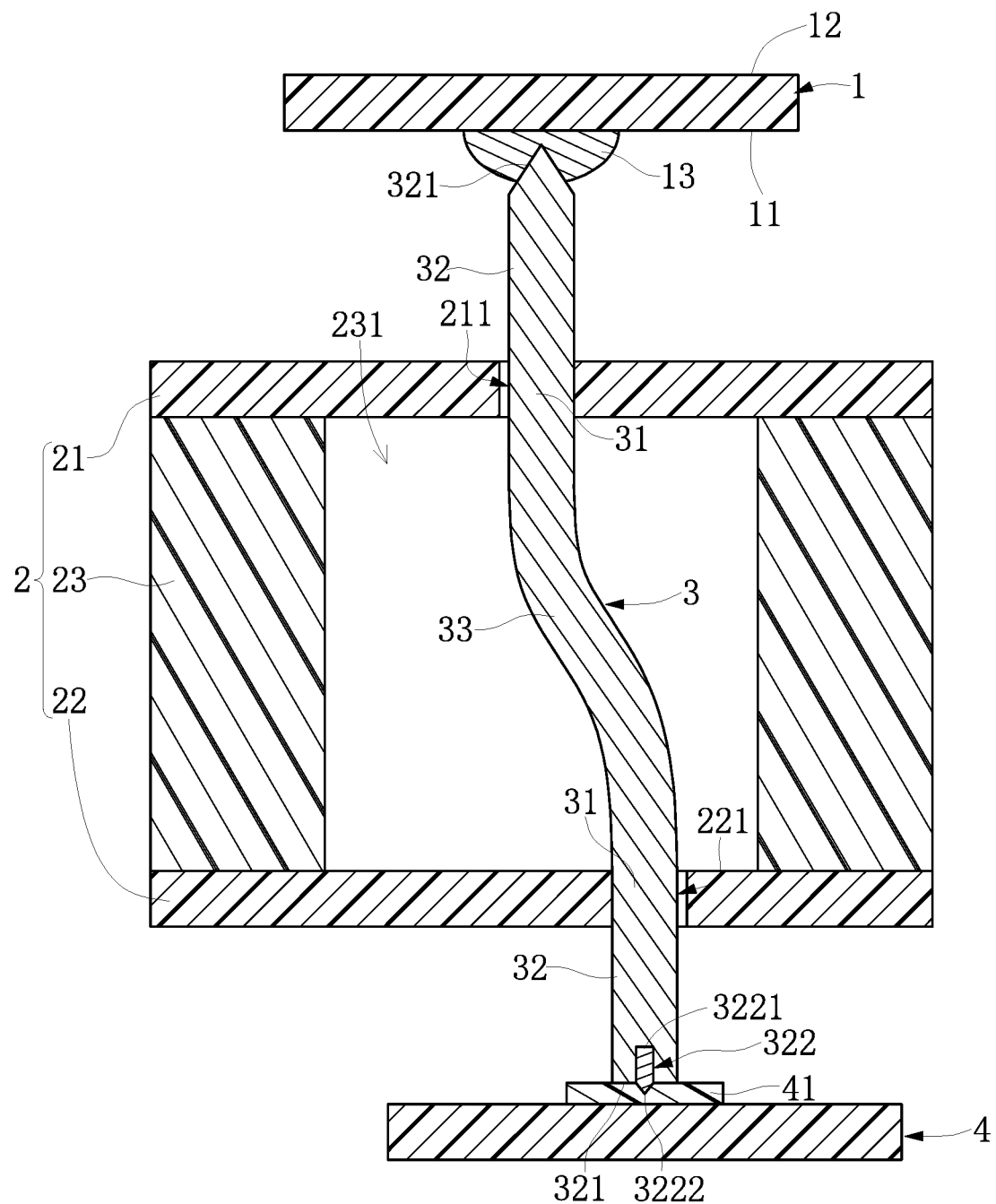
FIG. 7 is a cross-sectional view showing the probe card device with a spacer.

As shown in FIG. 7, the probe carrier 2 in the present embodiment may further include a spacer 23 sandwiched between the first die 21 and the second die 22. The spacer 23 has an accommodating hole 231 arranged at a central portion thereof. The middle segments 31 of the rectangular probes 3 are arranged in the accommodating hole 231 of the spacer 23, and are spaced apart from each other.

In each of the rectangular probes 3, each of the two contact end segments 32 includes a conductive portion 321, and the middle segment 33, the two extending segments 31, and the conductive portions 321 of the two contact end segments 32 are made of the same material and are integrally formed as a one-piece structure. In other words, a portion of each of the rectangular probes 3 excluding the two contact end segments 32 does not include a metallic material that is different from the conductive portion 32. In each of the rectangular probes 3, the two contact end segments 32 each can contact (or can be electrically connected to) an external metal pad through the conductive portion 321 thereof. Moreover, the external metal pad in the present embodiment can be the metal pad 13 of the transferring plate 1 or the metal pad 41 of the object 4.

Specifically, in each of the rectangular probes 3 of the present embodiment, at least one of the two contact end segments 32 includes a piercing portion 322 partially embedded in the conductive portion 321 thereof, and a free end of the piercing portion 322 is exposed from the corresponding conductive portion 321. Moreover, in each of the rectangular probes 3, the piercing portion 322 includes an embedded part 3221 embedded in the corresponding conductive portion 321 and an exposed part 3222 exposed from the corresponding conductive portion 321, and the free end of the piercing portion 322 is arranged on the exposed part 3222. As shown in FIG. 3, a length h1 of the embedded part 3221 in a height direction substantially perpendicular to the first surface 11 is at least two times a length h2 of the exposed part 3222 in the height direction.

As shown in FIGS. 2 and 3, one of the two contact end segments 32 of each of the rectangular probes 3 corresponding in position to (or arranged adjacent to) the object 4 has the piercing portion 322. When the contact end segment 32 having the piercing portion 322 contacts the metal pad 41 of the object 4, the exposed part 3222 of the piercing portion 322 pierces through an oxidation layer arranged on the metal pad 41 of the object 4 so as to form a rupture surface 411 on the metal pad 41, and the conductive portion 321 connected to the piercing portion 322 can abut against the rupture surface 411 of the metal pad 41 to improve electrical connection of the conductive portion 321 and the metal pad 41, preventing the conductive portion 321 and the metal pad 41 from an unstable connection. On the other hands, in each of the rectangular probes 3, the free end of the piercing portion 322 is configured to pierce into an external metal pad (e.g., the metal pad 41 of the object 4) so as to form a rupture surface 411 on the external metal pad.

Moreover, in each of the rectangular probes 3, the material of the piercing portion 322 is different from that of each of the two conductive portions 321, a conductivity of the piercing portion 322 is less than that of each of the two conductive portions 321, and a Vickers Hardness Number (Hv) of the piercing portion 322 is larger than that of each of the two conductive portions 321.

Specifically, in each of the rectangular probes 3, the conductivity of each of the two conductive portions 321 is $5.0 \times 10^{-4}$ S·m$^{-1}$ or more, a Young's modulus of each of the two conductive portions 321 is within a range of 40Gpa to 100Gpa, the conductivity of the piercing portion 322 is $4.6 \times 10^{-4}$ S·m$^{-1}$ or more, and a Young's modulus of the piercing portion 322 is 100Gpa or more. Furthermore, in each of the rectangular probes 3, the piercing portion 322 is preferably made of a material having an anti-sticking property. For example, a coefficient of friction of the piercing portion 322 is less than that of each of the two conductive portions 321, which is less than 0.5.

It should be noted that one of the two contact end segments 32 of each of the rectangular probes 3 corresponding in position to (or arranged adjacent to) the object 4 can have the piercing portion 322 as shown in FIGS. 2 and 3, and one of the two contact end segments 32 of each of the rectangular probes 3 corresponding in position to (or arranged adjacent to) the transferring plate 1 can have the piercing portion 322 as shown in FIG. 5, so that the metal pad 13 of the transferring plate 1 can be formed with a rupture surface (not labeled) by the corresponding piercing portion 322. Accordingly, as shown in FIG. 6, the two contact end segments 32 of each of the rectangular probes 3 each can have a piercing portion 322, so that the metal pads 13 and 41 of the transferring plate 1 and the object 4 each can be formed with a rupture surface (not labeled) by the two piercing portions 322 of each of the rectangular probes 3.

Figure 8:
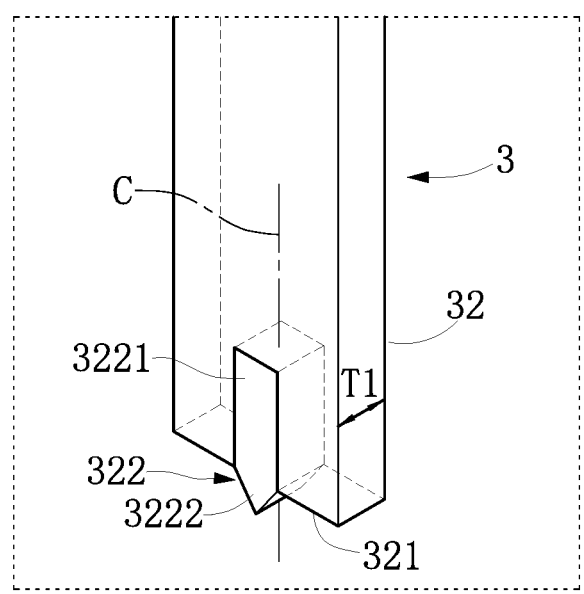
FIGS. 8 to 12 are a plurality of enlarged views each showing a contact end segment of the rectangular probe that has a conductive portion and a piercing portion.

The piercing portion 322 of the rectangular probe 3 in the present embodiment can be formed in a plurality of different configurations, such as configurations shown in FIGS. 8 to 12. As shown in FIG. 8, the rectangular probe 3 has a cross section that is in a rectangular shape, the piercing portion 322 is arranged in the contact end segment 32 along a central axis C of the contact end segment 32, and a thickness of the piercing portion 322 in a thickness direction T1 perpendicular to the central axis C is equal to that of the corresponding conductive portion 321. Specifically, two opposite side surfaces of the piercing portion 322 perpendicular to the thickness direction T1 are respectively exposed from that of the corresponding conductive portion 321 perpendicular to the thickness direction T1.

Figure 9:
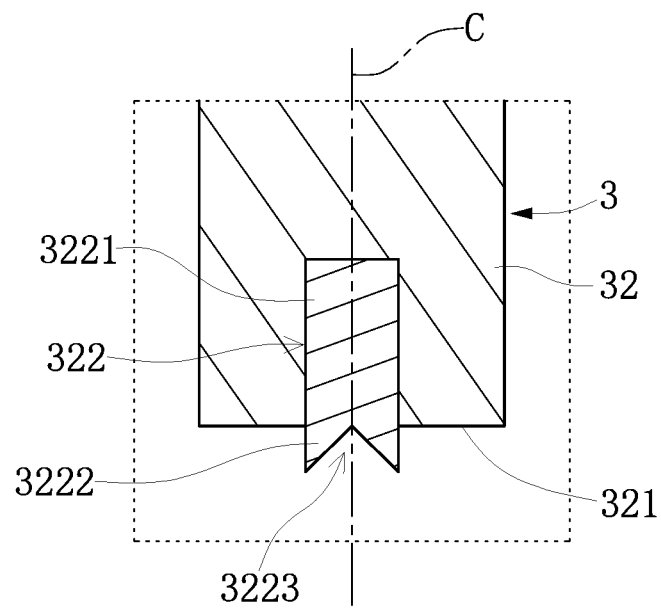

As shown in FIG. 9, the piercing portion 322 has a concave part 3223 formed at an end surface thereof arranged away from the corresponding conductive portion 321. Specifically, the concave part 3223 of the piercing portion 322 has a recess at a center position of the end surface of the exposed part 3222 toward the embedded part 3221 along the central axis C, so that the exposed part 3222 is arranged at two opposite sides of the concave part 3223 and formed with a bifurcation structure.

Figure 10:
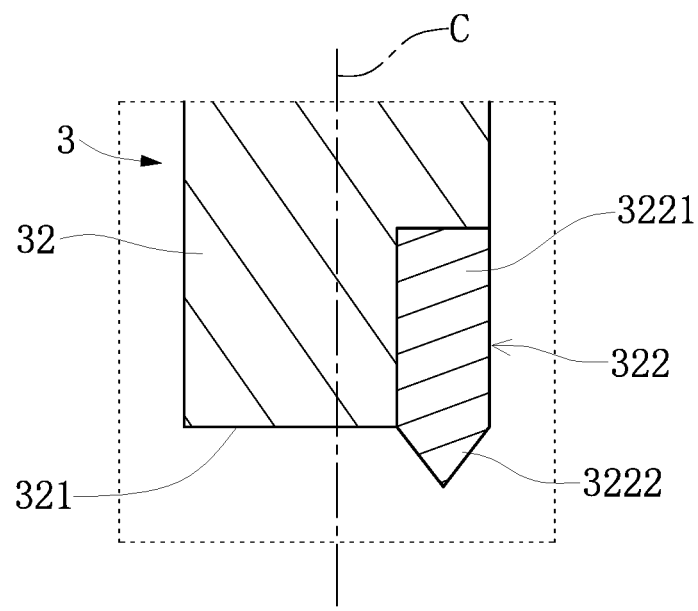

As shown in FIG. 10, the piercing portion 322 is arranged in the contact end segment 32 along a direction parallel to the central axis C of the contact end segment 32, and a central axis of the piercing portion 322 does not overlap with the central axis C of the contact end segment 32. Moreover, a lateral surface of the piercing portion 322 arranged away from the central axis C is exposed from that of the corresponding conductive portion 321.

Figure 11:
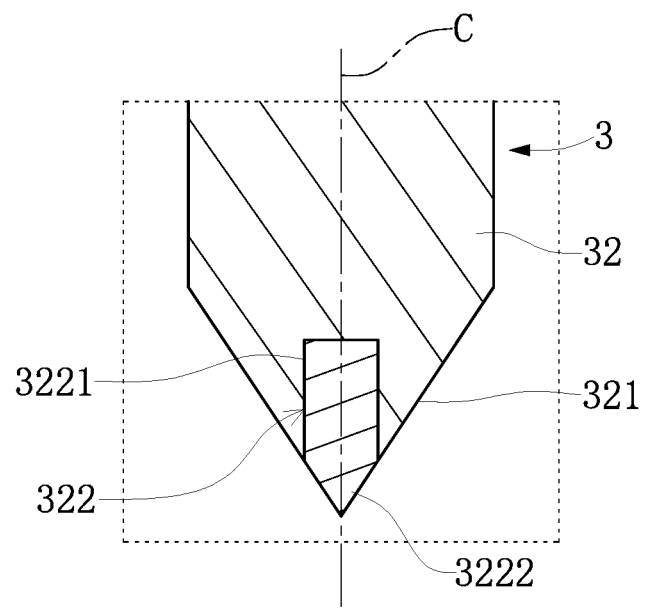

As shown in FIG. 11, the piercing portion 322 is arranged in the contact end segment 32 along the central axis C of the contact end segment 32, and the free end of the exposed part 3222 of the piercing portion 322 includes two oblique surfaces in a V-shape. Specifically, the two oblique surfaces of the exposed part 3222 are respectively coplanar with adjacent surfaces of the conductive portion 321, so that the piercing portion 322 and the corresponding conductive portion 321 are jointly formed as a V-shaped protrusion.

Figure 12:
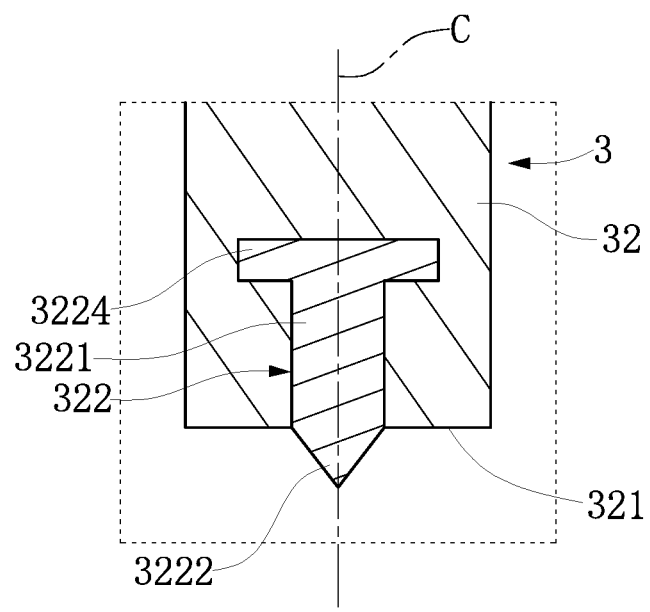

As shown in FIG. 12, the rectangular probe 3 further includes an engaged part 3224 connected to an end of the embedded part 3221 that is arranged away from the exposed part 3222, and the engaged part 3224 is also embedded in the conductive portion 321. Specifically, the embedded part 3221 and the engaged part 3224 are integrally formed in a T-shape, and a width of the engaged part 3224 perpendicular to the central axis C is larger than that of the embedded part 3221.

Technical Effects of the Present Embodiments

In summary, regarding the rectangular probe 3 or the probe card device 100 in the present disclosure, at least one of the two contact end segments 32 of the rectangular probe 3 is formed with a piercing portion 322 that is made of a material different from that of the corresponding conductive portion 321, so that the piercing portion 322 can provide an additional function to the corresponding contact end segment 32 to improve signal transmission. Specifically, the rectangular probe 3 can use the piercing portion 322 to pierce through the oxidation layer arranged on the external metal pad so as to form a rupture surface on the external metal pad, and the conductive portion 321 connected to the piercing portion 322 can abut against the rupture surface of the external metal pad to improve electrical connection of the conductive portion 321 and the external metal pad.

The descriptions illustrated supra set forth simply the exemplary embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A probe card device, comprising:
a first die;
a second die spaced apart from the first die in a height direction substantially perpendicular to the first die; and
a plurality of rectangular probes each including:
a middle segment arranged between the first die and the second die;
two extending segments respectively extending from two opposite ends of the middle segment, wherein the two extending segments are respectively arranged in the first die and the second die; and
two contact end segments respectively extending from two ends of the two extending segments along a direction away from the middle segment, and the two ends respectively arranged on the two extending segments and arranged apart from each other, wherein the two contact end segments are respectively arranged at two outer sides of the first die and the second die; each of the two contact end segments includes a conductive portion; the middle segment, the two extending segments, and the conductive portions of the two contact end segments are made of the same material and are integrally formed as a one-piece structure; at least one of the two contact end segments includes a piercing portion partially embedded in the conductive portion thereof, and a free end of the piercing portion is exposed from the corresponding conductive portion;
wherein in each of the rectangular probes, the material of the piercing portion is different from that of each of the two conductive portions, a conductivity of the piercing portion is less than that of each of the two conductive portions, and a Vickers hardness number of the piercing portion is larger than that of each of the two conductive portions,
wherein in each of the rectangular probes, the free end of the piercing portion is configured to pierce into an external metal pad so as to form a rupture surface on the external metal pad,
wherein in each of the rectangular probes, the conductivity of each of the two conductive portions is at least about $5.0\times10^{-4}$ S·m$^{-1}$, a Young's modulus of each of the two conductive portions is within a range of 40Gpa to 100Gpa, the conductivity of the piercing portion is at least about $4.6\times10^{-4}$ S·m$^{-1}$, and a Young's modulus of the piercing portion is 100Gpa or more, and wherein in each of the rectangular probes, a coefficient of friction between the piercing portion and the external metal pad is less than a coefficient of friction between each of the two conductive portions and the external metal pad, and the coefficient of friction between the piercing portion and the external metal pad is less than 0.5.

2. The probe card device as claimed in claim 1, wherein in each of the rectangular probes, the two extending segments respectively abut against the first die and the second die and are disposed in a staggered arrangement, and the middle segment is forced by the first die and the second die to be curved.

3. The probe card device as claimed in claim 1, further comprising a spacer sandwiched between the first die and the second die, wherein the spacer has an accommodating hole, and the middle segments of the rectangular probes are arranged in the accommodating hole of the spacer and are spaced apart from each other.

4. The probe card device as claimed in claim 1, wherein in each of the rectangular probes, one of the two contact end segments includes the piercing portion, and the other contact end segment further includes a piercing portion partially embedded in the conductive portion thereof.

5. The probe card device as claimed in claim 1, wherein in each of the rectangular probes, the piercing portion includes an embedded part embedded in the corresponding conductive portion and an exposed part exposed from the corresponding conductive portion, the free end of the piercing portion is arranged on the exposed part, and a length of the embedded part in the height direction is at least two times a length of the exposed part in the height direction; a portion of each of the rectangular probes excluding the two contact end segments does not include a metallic material that is different from the conductive portion.

6. A rectangular probe of a probe card device, comprising:
a middle segment;
two extending segments respectively extending from two opposite ends of the middle segment; and
two contact end segments respectively extending from two ends of the two extending segments along a direction away from the middle segment, and the two ends respectively arranged on the two extending segments and arranged apart from each other, wherein each of the two contact end segments includes a conductive portion; the middle segment, the two extending segments, and the conductive portions of the two contact end segments are made of the same material and are integrally formed as a one-piece structure; at least one of the two contact end segments includes a piercing portion partially embedded in the conductive portion thereof, and a free end of the piercing portion is exposed from the corresponding conductive portion,
wherein the material of the piercing portion is different from that of each of the two conductive portions, a conductivity of the piercing portion is less than that of each of the two conductive portions, and a Vickers hardness number of the piercing portion is larger than that of each of the two conductive portions,
wherein the free end of the piercing portion is configured to pierce into an external metal pad so as to form a rupture surface on the external metal pad, and the conductive portion arranged adjacent to the piercing portion abuts against the rupture surface, and
wherein the conductivity of each of the two conductive portions is at least about $5.0\times10^{-4}$ S·m$^{-1}$, a Young's modulus of each of the two conductive portions is within a range of 40Gpa to 100Gpa, the conductivity of the piercing portion is at least about $4.6 \times 10^{-4} S \cdot m^{-1}$, a Young's modulus of the piercing portion is 100Gpa or more, and a coefficient of friction between the piercing portion and the external metal pad is less than 0.5.

\* \* \* \* \*